United States Patent
Tang

(10) Patent No.: US 7,037,403 B1
(45) Date of Patent: *May 2, 2006

(54) IN-SITU REAL-TIME MONITORING TECHNIQUE AND APPARATUS FOR DETECTION OF THIN FILMS DURING CHEMICAL/MECHANICAL POLISHING PLANARIZATION

(75) Inventor: Wallace T. Y. Tang, Warren, NJ (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/134,147

(22) Filed: Aug. 14, 1998

Related U.S. Application Data

(62) Division of application No. 08/401,229, filed on Mar. 9, 1995, now Pat. No. 5,949,927, which is a division of application No. 07/996,817, filed on Dec. 28, 1992.

(51) Int. Cl.
*B24B 49/12* (2006.01)
*G01B 11/00* (2006.01)

(52) U.S. Cl. .................................................. 156/345.16
(58) Field of Classification Search ............ 156/345.25, 156/345.24, 345.28, 345.12, 345.13; 385/12, 385/25, 115; 451/6; 438/692, 8, 16
See application file for complete search history.

(56) References Cited

U.S. PATENT DOCUMENTS 2,578,859 A    12/1951  Teeple et al.
2,973,686 A     3/1961  Dreyfus et al.

(Continued)

FOREIGN PATENT DOCUMENTS

CA    625573       8/1961
EP    0 352 740 A2  1/1990
EP    0 738 561 A1  3/1996

(Continued)

OTHER PUBLICATIONS

A. Novembre, et al. BACUS—9th Annual Symposium, "Automated Process Control of Poly(Butene–1–Sulfone) PBS Resist Development," (Sep. 1989) pp. 139–144.
A. Novembre, et al. SPIE, vol. 1087, Integrated Circuit Metrology, Inspection, and Process Control III (1989) An In Situ Interferometric Analysis of Resist Development on Photomask Substrates, pp. 460–468.
A. Novembre, et al. SPIE, vol. 1809, 12th Annual BACUS Symposium (1992), Initial manufacturing performance of an actively controlled PBS resist development process (pp. 76–84.
Wallace T.Y. Tang, U.S. Appl. No. 11/043,486, filed Jan. 25, 2005, 27 pp.

(Continued)

*Primary Examiner*—Parviz Hassanzadeh
*Assistant Examiner*—Sylvia R. MacArthur
(74) *Attorney, Agent, or Firm*—Fish & Richardson

(57) ABSTRACT

A technique and apparatus is disclosed for the optical monitoring and measurement of a thin film (or small region on a surface) undergoing thickness or other changes while it is rotating. An optical signal is routed from the monitored area through the axis of rotation and decoupled from the monitored rotating area. The signal can then be analyzed to determine an endpoint to the planarization process. The invention utilizes interferometric and spectrophotometric optical measurement techniques for the in situ, real-time endpoint control of chemical-mechanical polishing planarization in the fabrication of semiconductor or various electrical devices.

23 Claims, 2 Drawing Sheets

U.S. PATENT DOCUMENTS

| | | |
|---|---|---|
| 3,510,667 A | 5/1970 | Cleveland et al. |
| 3,623,813 A | 11/1971 | Haeman ............... 356/357 |
| 3,630,795 A | 12/1971 | Vorie |
| 3,869,211 A | 3/1975 | Wantanabe et al. |
| 3,986,777 A | 10/1976 | Roll |
| 4,272,924 A | 6/1981 | Masuko et al. |
| 4,328,068 A | 5/1982 | Curtis |
| 4,398,791 A | 8/1983 | Dorsey |
| 4,436,367 A | 3/1984 | Lewis et al. |
| 4,529,986 A | 7/1985 | d'Auria et al. |
| 4,547,073 A * | 10/1985 | Kugimiya ............... 356/613 |
| 4,569,717 A | 2/1986 | Ohgami et al. |
| 4,618,262 A | 10/1986 | Maydan et al. .......... 356/357 |
| 4,672,200 A | 6/1987 | Claypool et al. |
| 4,680,084 A | 7/1987 | Heimann et al. |
| 4,711,516 A | 12/1987 | Graber |
| 4,713,140 A | 12/1987 | Tien |
| 4,776,695 A | 10/1988 | van Pham et al. |
| 4,793,895 A | 12/1988 | Kaanta et al. |
| 4,851,311 A | 7/1989 | Millis et al. |
| 4,879,258 A | 11/1989 | Fisher |
| 4,929,828 A | 5/1990 | Claypool |
| 4,948,259 A | 8/1990 | Enke et al. |
| 4,975,141 A * | 12/1990 | Greco et al. ............... 216/60 |
| 4,998,021 A | 3/1991 | Mimasaka .............. 356/357 |
| 4,999,509 A | 3/1991 | Wada et al. |
| 5,020,283 A | 6/1991 | Tuttle |
| 5,036,015 A | 7/1991 | Sandhu et al. |
| 5,046,849 A | 9/1991 | Severin et al. |
| 5,069,002 A | 12/1991 | Sandhu et al. |
| 5,081,421 A | 1/1992 | Miller et al. |
| 5,081,796 A | 1/1992 | Schultz |
| 5,097,430 A | 3/1992 | Birang |
| 5,120,966 A | 6/1992 | Kondo |
| 5,132,617 A | 7/1992 | Leach et al. |
| 5,196,353 A | 3/1993 | Sandhu et al. |
| 5,219,787 A | 6/1993 | Carey et al. |
| 5,234,868 A | 8/1993 | Cote |
| 5,242,524 A | 9/1993 | Leach et al. |
| 5,257,478 A | 11/1993 | Hyde et al. |
| 5,265,378 A | 11/1993 | Rostoker |
| 5,294,289 A | 3/1994 | Heinz et al. |
| 5,297,364 A | 3/1994 | Tuttle |
| 5,308,438 A | 5/1994 | Cote et al. |
| 5,308,447 A | 5/1994 | Lewis et al. |
| 5,321,304 A | 6/1994 | Rostoker |
| 5,329,734 A | 7/1994 | Yu |
| 5,332,467 A | 7/1994 | Sune et al. |
| 5,337,015 A | 8/1994 | Lustig et al. |
| 5,394,655 A | 3/1995 | Allen et al. |
| 5,413,651 A | 5/1995 | Otruba |
| 5,413,941 A * | 5/1995 | Koos et al. ............... 438/16 |
| 5,433,651 A * | 7/1995 | Lustig et al. |
| 5,483,568 A | 1/1996 | Yano et al. |
| 5,499,733 A | 3/1996 | Litvak |
| 5,605,760 A | 2/1997 | Roberts |
| 5,893,796 A | 4/1999 | Birang et al. |
| 5,910,043 A | 6/1999 | Manzonic et al. |
| 5,948,259 A | 9/1999 | Deguitre et al. |
| 5,949,927 A | 9/1999 | Tang |
| 5,964,643 A | 10/1999 | Birang et al. |
| 6,045,439 A | 4/2000 | Birang et al. |
| 6,280,290 B1 | 8/2001 | Birang et al. |
| 6,413,867 B1 * | 7/2002 | Sarfaty et al. ............. 438/689 |

FOREIGN PATENT DOCUMENTS

| | | |
|---|---|---|
| FR | 1.075.634 | 10/1954 |
| JP | 57-138575 | 8/1982 |
| JP | 58-4353 | 1/1983 |
| JP | 59-57215 A | 4/1984 |
| JP | 59-57215 | 4/1984 |
| JP | 59-74635 | 4/1984 |
| JP | 60-79304 | 5/1985 |
| JP | 61-164773 | 7/1986 |
| JP | 02015625 A * | 1/1990 |
| JP | H02-86128 | 7/1990 |
| JP | 02086128 U | 7/1990 |
| JP | 2-222533 A * | 9/1990 |
| JP | 02222533 A * | 9/1990 |
| JP | 3-234467 | 10/1991 |
| JP | H05-69311 | 3/1993 |
| JP | 5-138531 | 6/1993 |
| JP | 5-309558 | 11/1993 |
| JP | 7-52032 | 2/1995 |
| KR | 92-20600 | 11/1992 |
| WO | WO 93/20976 | 10/1993 |

OTHER PUBLICATIONS

Anonymous, "End–Point Detection of Oxide Polishing and Planarization of Semiconductor Devices," *Research Disclosure*, 1992, No. 340, Kenneth Mason Publications Ltd., England.

Carlotta et al., "Effect of thickness and surface treatment on silicon wafer reflectance," *Solar Energy Materials and Solar Cells*, 1992, 27:265–272.

Henck, "In situ real–time ellipsometry for film thickness measurement and control," *J. Vac. Sci. Technol. A.*, 1992, 10(4):934–938.

Jurczyk et al., "Process Detection System," IBM Technical Disclosure Bulletin, 1975, 18(6):1867–1870.

Nakamura et al., "Mirror Polishing of Silicon Wafters (4th Report),"—Development of Bowl Feed and Double Side Polishing Machine with In–situ Thickness Monitoring of Silicon Wafers, *JSPE*, pp. 129–134.

Sautter et al., "Development process control and optimization utilizing and end point monitor," *SPIE*, 1989, 1087:312–316.

* cited by examiner

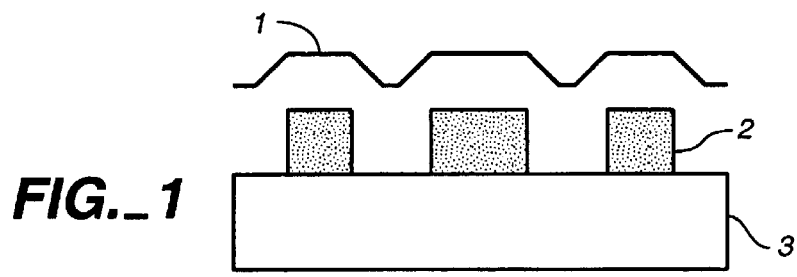
FIG._1
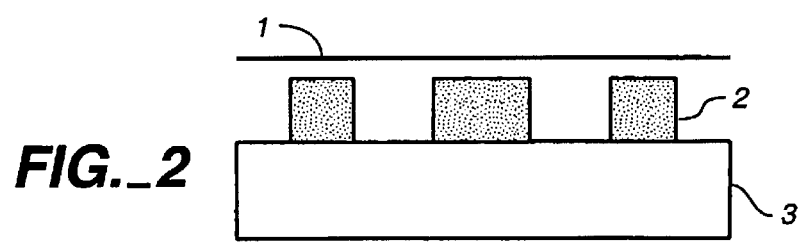
FIG._2
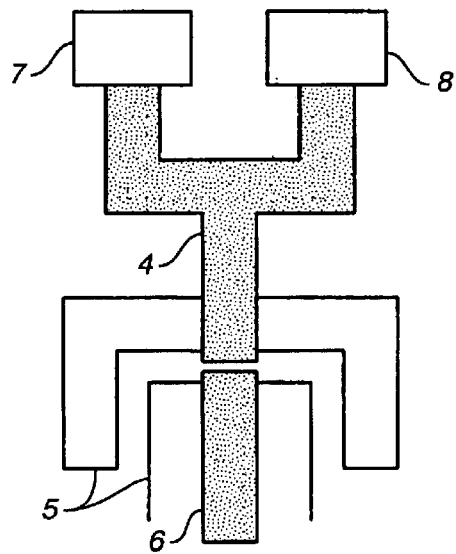
FIG._3
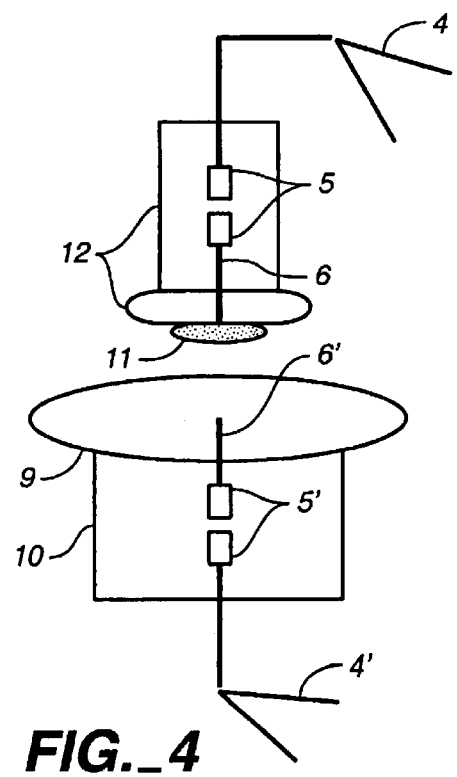
FIG._4

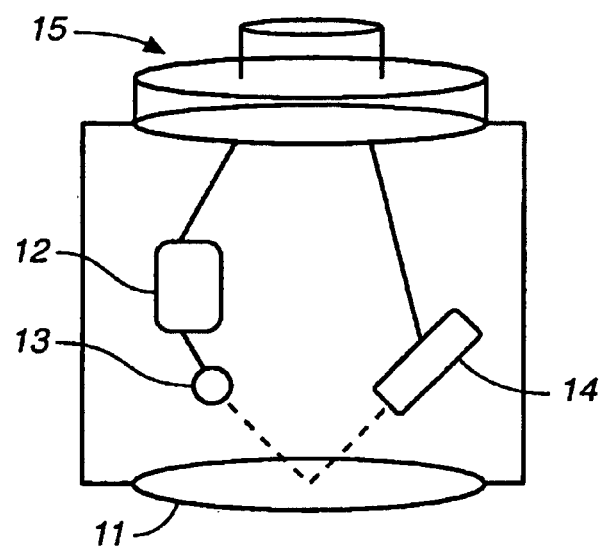
FIG._5
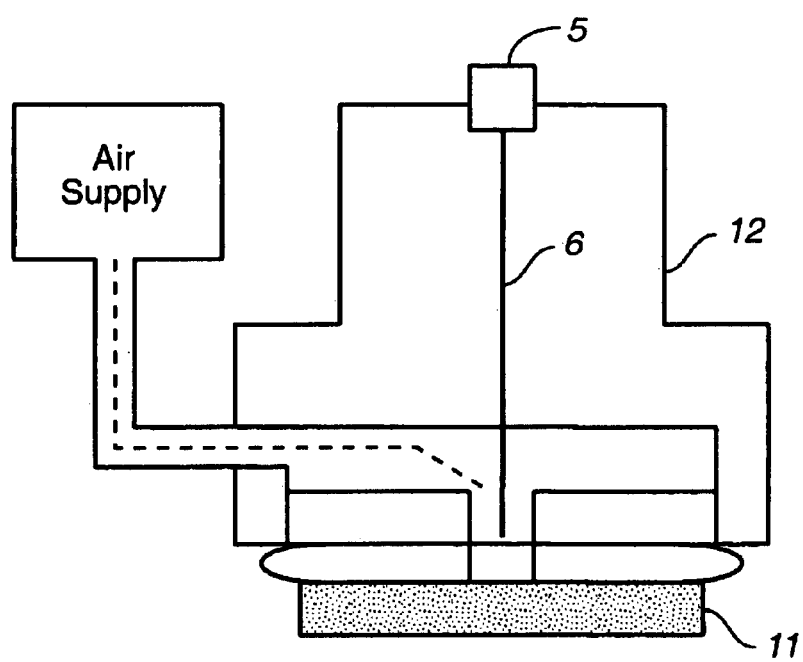
FIG._6

IN-SITU REAL-TIME MONITORING TECHNIQUE AND APPARATUS FOR DETECTION OF THIN FILMS DURING CHEMICAL/MECHANICAL POLISHING PLANARIZATION

This application is a division of U.S. Ser. No. 08/401,229 filed on Mar. 9, 1995, now U.S. Pat. No. 5,949,927, which is a divisional of U.S. Ser. No. 07/996,817 filed on Dec. 28, 1992 now U.S. Pat. No. 6,614,529.

FIELD OF THE INVENTION

The present invention is directed to a technique and apparatus for the optical monitoring and measurement of a surface undergoing rotation, particularly for in situ, real-time monitoring of any thin film undergoing rotation and simultaneous dimensional changes. It is particularly useful in the field of wafer planarization for producing wafers of extreme flatness and uniformity that are desirable in the production of semiconductor and integrated circuits.

BACKGROUND OF THE INVENTION

As microelectronic device dimensions continue to shrink, patterning problems increasingly hinder integrated circuit and semiconductor device fabrication. Semiconductor device fabrication often requires extremely planar surfaces and thin films of precise thicknesses. The surfaces requiring planarization and thickness control in semiconductor devices include areas or layers of dielectric material (such as $SiO_2$) on the surface of semiconducting materials and other device pattern layers. The insulating dielectric layers and other device layers need to be extremely planar because irregularities and rough topography lead to fabrication problems, including Depth of Focus budget (hereafter DOF) problems. Since an irregularity in the surface can cause part of the surface to be out of focus at a particular distance between the optical system and the wafer, errors in pattern formations can occur. Also, the thickness of layers needs to be precisely controlled because variations in thickness may affect the electrical properties of the layers and adjacent device patterns particularly in the interconnections between the different layers of microelectronic devices.

The precise control of layer thickness is also crucial in semiconductor device fabrication. In VLSI technology, certain layers of multi-layer devices are generally electrically interconnected. These layers are also typically insulated from various levels by thin layers of insulating material such as $SiO_2$. In order to interconnect the device layers, contact holes are often formed in the insulating layers to provide electrical access therebetween. If the insulating layer is too thick, the layers may not connect, if the layer is too thin, the hole formation process may damage the underlying device layer.

Due to the various inadequacies of other planarization methods (such as spin-on-glass and etchback), Chemical/Mechanical Polishing (hereafter CMP) planarization machines and other lapping machines have been developed and employed to provide planar surfaces for semiconductor device fabrication. Generally, CMP is a technique of planarizing wafers through the use of a polishing pad attached to a rotating table. The wafer is held by a chuck above a polishing pad which rotates on a spindle. The wafer is pressed downward against the polishing pad. The nap of the rotating pad removes bits of the film layer, thereby planarizing the surface. A solution of pH controlled fluid and colloidal silica particles called slurry flows between the pad and the wafer to remove material from the polishing area and to enhance the planarization of the wafer surface.

A typical method of determining the endpoint of CMP and lapping machines is to measure the amount of time needed to planarize standard wafer(s), and then to process the remaining wafers for a similar amount of time. In practice, this process is very inefficient because it is very difficult to determine the precise rate of film removal, as polishing conditions and the polishing pad change from wafer to wafer over time. As a result, it is often necessary to inspect the wafers individually after planarization, which is time-consuming and expensive. Thus, the CMP process could be significantly improved by introducing an in situ, real-time measurement and control system.

The ability to monitor and control the CMP process has been directly and indirectly addressed by several techniques. One method is based on measuring capacitance (U.S. Pat. No. 5,081,421). The theory behind this method is that the electrical capacitance of the wafer changes as the wafer surface is planarized. The two primary drawbacks of the method are its limited accuracy and its pattern dependency. Its accuracy can be compromised by the patterns of underlying layers which may also affect the capacitance of the entire system.

One direct method has been proposed which uses laser light to make interferometric readings on the polished side (front side) of a section of the wafer which overhangs the polishing pad (U.S. Pat. No. 5,081,796). The disadvantages of this system are that it requires substantial modification of the conventional CMP process since part of the wafer must overhang the edge of the polishing pad, leading to polishing uniformity problems, and also, the monitored spot on the rotating wafer must be coordinated with the apparatus underneath the wafer overhang.

An indirect method of monitoring CMP has been developed which senses the change in friction between the wafer and the polishing surface (U.S. Pat. No. 5,036,015). The change in friction may be produced when, for instance, an oxide coating of the wafer is removed and a harder material is contacted by the polishing pad. The accuracy of the method suffers from variations in changing pad conditions. In addition, use of the method may be limited by the need to sense the friction generated by different materials.

Another indirect method of monitoring CMP has been developed utilizing the conductivity of the slurry during polishing (U.S. Pat. No. 4,793,895). When metal layers are exposed during the CMP process, the electrical resistivity of the slurry and wafer changes due to the exposed metal on the wafer surface. The obvious drawback of this method is that it requires having exposed metal surfaces for monitoring. This is not possible for most types of polishing situations.

Another indirect method of monitoring CMP has been developed utilizing the waste slurry off the pad during planarization (U.S. Pat. No. 4,879,258). Certain materials are imbedded in the dielectric layer and monitored as they are planarized and fall off the polishing pad. The obvious drawbacks to this method include the time delay between planarization and when the slurry reaches the edge of the pad (estimated to be approximately 30 seconds) and also the low levels of sensitivity and signal noise introduced by the materials left over from the previous wafers. This method is not an active, real-time method.

These and other endpoint detection techniques do not offer effective and accurate control of the CMP process in an in situ, real-time manner. These schemes either compromise the accuracy of the endpoint detection and/or require significant alterations of the CMP process.

BRIEF DESCRIPTION OF THE FIGS.

FIG. 1 is a side view of a representative semiconductor device with a device pattern on a substrate of semiconductive material and a thick, unplanarized dielectric layer over the pattern and substrate.

FIG. 2 illustrates the semiconductor device of FIG. 1 after the dielectric layer has undergone CMP planarization.

FIG. 3 is a side view of a rotating coupler fitted with fiber-optic cable.

FIG. 4 is a side view representation of the fiber-optic embodiment of the present invention integrated with a CMP assembly. The fiber-optic apparatus is pictured in both a front side and a back side approach.

FIG. 5 shows another embodiment of the present invention utilizing a light source which transmits light in the direction of the wafer, where it is reflected off the wafer's surface and the reflection is monitored by a photodetector which converts the light signal to an electrical signal. The electrical signal can be relayed to an analyzer after passing through an electrical slip ring.

FIG. 6 illustrates a wafer-holding chuck shown in FIG. 4, wherein air has been pumped into a cavity above the wafer to compensate for loss of pressure against the back of the wafer where holes are located.

SUMMARY OF THE INVENTION

An object of the present invention is to avoid the above-mentioned problems by allowing for the monitoring of a region of a film on a substrate undergoing thickness changes, thus enabling endpoint detection in an in situ, real-time manner. In addition, if the monitored region is sufficiently small, a spot on the wafer can be dedicated for endpoint purposes. The dedicated endpoint pot can remove signal problems associated with the layer's topology, patterns, and multiple film layers.

The present invention thus provides an apparatus and method for the optical illumination and monitoring of a section on a thin film layer undergoing dimensional changes. Light from a light source is transmitted to a monitoring area on the layer, preferably through the back side of the substrate, and relayed back to an analyzer which evaluates changes in thickness of the substrate based on interferometric, spectrophotometric, and/or absorption changes. In a preferred embodiment, the light signal is advantageously measured from the back side of the substrate, which facilitates implementation since the monitored region of the wafer and the monitoring apparatus do not need to be timed and coordinated during the process.

DETAILED DESCRIPTION OF THE INVENTION

In one embodiment, the present invention is a method of monitoring the thickness change of a film on a substrate comprising illuminating a section of the film through the back side (the side which is not being processed) of the substrate, measuring a light signal returning from the illuminated section, and determining change in thickness of the film on a substrate based on the measured light signal. Thickness change can be determined by an analyzer, which analyzes interferometric, spectrophotometric, absorption, and/or other optical changes in the measured light signal. Optionally, if the substrate is undergoing rotation, the method further comprises the step of relaying the light signal to a rotating coupler which links the signal to an analyzer.

Another embodiment of the present invention is a method of monitoring the change in thickness of a film on a substrate comprising illuminating a section of the film from the front side (i.e., the side being polished) of the substrate, measuring a light signal returning from the illuminated section, and relaying the light signal to a rotating coupler which connects to an analyzer, and monitoring thickness change with the analyzer, which analyzes interferometric, spectrophotometric, absorption, and/or other optical changes in the measured light signal.

Another embodiment of the present invention is an apparatus for monitoring thickness change in a film on a substrate comprising a light source which illuminates a section of the film from either the front side or back side of the substrate to generate a light signal, means for detecting the light signal, means for analyzing the light signal, a rotating coupler for relaying the light signal from the illuminated section to the means for analyzing the light signal, and optionally one or more focusing lenses.

Preferably, the apparatus comprises
(i) a bifurcated fiber-optic cable having a common leg and two bifurcated legs,
(ii) a rotating fiber-optic cable with two ends,
(iii) a light source,
(iv) means for analyzing a light signal, and
(v) a rotating coupler having a stationary end and a rotating end,
wherein the first bifurcated leg of the bifurcated fiber-optic cable is connected to the light source, the second bifurcated leg is connected to the means for analyzing a light signal, and the common leg is connected to the stationary end of the rotating coupler, and wherein one end of the rotating fiber-optic cable is connected to the rotating end of the rotating coupler and the other end is held in close proximity to the film on a substrate undergoing processing.

"Close proximity" includes any distance between the end of the rotating fiber-optic cable and the film on the substrate that is close enough to permit effective illumination of the monitored area of the film and effective reception of the returning light signal. A preferred distance is less than or equal to about 1 cm.

The rotating fiber-optic cable serves both to transmit light from the light source to the illuminated section and to transmit the returning light signal on its way back from the illuminated section. Light from the light source travels down the first bifurcated leg of the bifurcated fiber-optic cable and passes through the rotating coupler down the rotating fiber-optic cable to illuminate the film on a substrate. The returning light signal is relayed by the second bifurcated leg of the bifurcated fiber-optic cable to the analyzer. In addition, more than one section of the film on a substrate can be monitored at a time by using multiple legs of rotating fiber-optic cables which pass through one or more rotating couplers.

Preferably, the fiber-optic cable comprises multiple optic fibers bundled together. However, the fiber-optic cable may comprise a single fiber. Alternatively, it may be a combination of bundled fiber-optic cable and single fiber fiber-optic cable. Alternatively, it may be multiple fiber-optic cables bundled together.

The term "substrate" includes any insulating, conductive, and semiconductive materials known in the art. Preferred substrates are wafers such as silicon wafers, gallium-arsenide wafers, and silicon on insulator (SOI) wafers.

The term "film on a substrate" includes various dielectric layers known in the art, such as $SiO_2$, metal layers such as tungsten and aluminum, and various other films such as silicon films found on the substrate as defined above. The films also include resist layers.

The film undergoing thickness change, for example, may be a film on a substrate in a chemical mechanical polishing (CMP) process, a chemical vapor deposition process, a resist development process, a post-exposure bake, a spin coating process, or a plasma etching process. In the CMP embodiment, the film is located at the interface of the substrate and the polishing pad.

The term "light source" includes any source of light capable of illuminating a film on a substrate in the range of about 200 to about 11,000 nanometers in wavelength. If the light signal is measured from the back side of the substrate, the wavelength is preferably between about 1,000 and about 11,000 nanometers. A preferred back side wavelength is 1,300 nanometers. If the light signal is measured from the front side, then the wavelength is preferably between about 200 and about 11,000 nanometers. A preferred front side wavelength is 632.8 nanometers. Preferably, the section of the film on the substrate is continuously illuminated by the light source, although illumination can be at timed intervals.

Suitable means for analyzing the light signal, or "analyzers", include photodetectors, interferometers, spectrophotometers and other devices known in the art for measuring interferometric, spectrophotometric, absorption, and/or other optical changes.

Suitable rotating couplers include any couplers known in the art for coupling a rotating member to a non-rotating member provided that light is permitted to pass between the ends of the two members. Such, couplers are disclosed, for example, in U.S. Pat. Nos. 4,398,791 and 4,436,367. Preferably, the means for coupling the rotating fiber-optic cable to the bifurcated fiber-optic cable which is not rotating comprises a rotating member which attaches to one end of the rotating fiber-optic cable. The rotating member is fitted into a stationary member of the rotating coupler which is attached to the common leg of the bifurcated fiber-optic cable. The coupler is designed such that the end of the rotating fiber-optic cable is held in close proximity, preferably less than 1 cm, to the common leg of the bifurcated fiber-optic cable, thereby permitting light to pass between the two ends. Optionally, the cable ends can be fitted with focusing lenses to enhance signal transmission.

The rotating coupler can be replaced with other types of couplers, including off-axis fiber-optic couplers, electrical slip rings, or a combination of the aforementioned couplers, or with other means of signal rotation decoupling.

Typical CMP machines in which the methods and apparatus of the present invention can be used are those produced by R. Howard Strasbaugh, Inc. in San Luis Obispo, Calif. Westech Systems, Inc. in Phoenix, Ariz. and Cybeq Systems in Menlo Park, Calif.

FIGS. 1 and 2 illustrate CMP planarization of a semiconductor device wafer. In FIG. 1 is shown a representative semiconductor device, which includes a dielectric layer such as $SiO_2$, 1, deposited on the surface of a device pattern, 2, formed on a silicon wafer substrate, 3. The dielectric layer may be formed in a manner such as chemical vapor deposition (CVD) of oxide, spin-on-glass, or by other means. FIG. 2 shows the wafer of FIG. 1, but with the dielectric layer, 1, planarized to a preselected thickness after CMP. The device pattern, 2, and the wafer substrate, 3, are relatively unchanged in this process.

FIG. 3 is a side view representation of a preferred embodiment of the optical rotating coupler apparatus. FIG. 3 shows a bifurcated fiber-optic cable, 4, one bifurcated leg of which connects to a light source, 7, and another bifurcated leg of which connects to a photodetector, 8, which in turn is connected to signal conditioning electronics and a computer processing and control system (not shown). The common leg of the bifurcated fiber-optic cable, 4, connects to an optical rotating coupler, 5. A rotating fiber-optic cable, 6, extends from the rotating coupler to the area of the wafer substrate to be monitored. The fiber-optic cables, 4 and 6, may be either single fiber or bundled fiber types. Also, it is possible to use several fiber-optic cables or fibers instead of one cable or fiber. Also, it is possible to make a hybrid single fiber and bundled fiber cable embodiment, e.g., cable 4 is single fiber and cable 6 is bundled cable. Focusing lenses are not necessary at the monitoring end of cable 6 if the cable is fixed securely and closely enough to the monitoring area of the wafer substrate. Preferably, the distance between the end of cable 6 and the wafer substrate is less than 1 cm.

FIG. 4 is a side view representation of a typical CMP planarizer or lapping machine adapted with the apparatus shown in FIG. 3. The apparatus may be set up in the planarizer from a back side approach with 4, 5, and 6, or from a front side approach with 411 51, and 61. only one of the approaches, either back side or front side, is needed at any one time for effective monitoring. In FIG. 4, the wafer holding-chuck and spindle, 12, is shown integrated with a rotating coupler, 5, for the back side approach. The bifurcated fiber-optic cable, 4, is fed into the spindle, 12, and connected to the stationary portion of the rotating coupler, 5, as shown in FIG. 3. The rotating fiber-optic cable, 6, is fed down the spindle to the monitored area of the wafer, 11, which monitored area is optionally a patternless area such as a clear area or die or which is optionally an area having a pattern. The wafer, 11, is held to the chuck by a mounting pad or "fixture" which is generally attached to the chuck by a chemical adhesive. The fixture is often composed of a base matrix held together by a polyurethane surface layer. The outer surface which holds and presses against the back of the wafer, grips the wafer, and also provides uniform support for the wafer.

In the other embodiment shown in FIG. 4, the rotating table base, 10, and platen, 9, which holds the polishing pad is shown integrated with a rotating coupler, 5', for a front side approach to the wafer. The bifurcated fiber-optic cable, 4', is fed into the rotating table base, 10, and connected to the stationary portion of the rotating coupler, 5'. The rotating fiber-optic cable, 6', connected to the rotating shaft of the rotating coupler, 5', is adjacent to the monitoring area of the wafer. As the polishing pad attached to the platen, 9, is generally perforated, the end of the fiber-optic cable, 6', can be embedded in one of the holes. Translucent slurry solution flows in between the polishing pad and the wafer, scattering most visible light wavelengths. Optionally, signal enhancement means can be used to compensate for slurry scattering effects of different light wavelengths. In the preferred embodiment, the source light for the front side method is 632.8 nanometer wavelength light, a wavelength balancing the concerns of light signal transmission through the slurry, and also accuracy of measurement. The rotating fiber-optic cable, 6', embedded in the polishing pad must transmit and receive the interference signal when it is positioned over the measurement area on the wafer, 11. This is coordinated so that the monitoring optics pass over the monitored area on the wafer using ordinary skill in the art.

FIG. 5 illustrates the use of an electrical slip ring assembly. A light source, 14, transmits light to a point on the wafer, 11, which causes the light to reflect in the direction of the photodetector or other light-monitoring electronics, 13, which convert the light signal into an electrical signal. The electrical signal may then be passed on to an analyzer, 12, and finally, to an electrical slip ring, 15, where it is decoupled from rotation and passed on to other analyzers which monitor the progress of CMP.

FIG. 6 illustrates a wafer-holding chuck and spindle, 12, wherein the rotating fiber-optic cable, 6, has been routed from the coupler, 5, through the wafer-holding chuck, 12, to a point behind the wafer, 11, during the CMP process. If the pad or "fixture" which holds the wafer does not allow the passage of light, then it can be perforated to provide an optical access to the wafer. In order to compensate for the loss of pressure against the wafer at the point of optical access, air may optionally be pumped into the cavity to press against the wafer and compensate for the loss of pressure. Alternatively, if the fixture is able to transmit light, then the perforation for optical access is not necessary.

While the invention has been described in detail and with reference to specific embodiments thereof, it will be apparent to one skilled in the art that various changes and modifications can be made therein without departing from the spirit and scope of the invention.

What is claimed is:

1. A chemical mechanical polisher for planarizing a film on one side of a substrate having two sides, the polisher comprising:
    a rotatable platen configured to receive a polishing pad, the polisher being operable to polish the film by rotating the platen to cause relative motion between the platen and the substrate;
    at least one light source that is operable to transmit light through the polishing pad and toward the substrate from the side of the substrate with the film to illuminate at least one section on the film and reflect light off the illuminated section of the film; and
    at least one device to receive the reflected light from the film on the substrate while the film is being polished, the at least one device being operable to monitor a dimensional change of the film based on the reflected light from the film on the substrate.

2. The polisher as claimed in claim 1 wherein the at least one device is positioned on the same side of the substrate as the light source.

3. The polisher as claimed in claim 1 wherein the at least one light source is operable to illuminate such that each monitored section is minimized in size to remove signal problems.

4. The polisher as claimed in claim 1, wherein the light source is configured to illuminate only one section, the section illuminated being a dedicated measurement area.

5. The polisher as claimed in claim 1, wherein the light source is configured to illuminate more than one section.

6. The polisher as claimed in claim 1 wherein the device that monitors a dimensional change includes a photodetector connected for sending signals to one of an interferometer and a spectrophotometer.

7. The polisher as claimed in claim 1 wherein the light source is a laser.

8. A chemical mechanical polisher for planarizing a film on one side of a substrate having two sides, the polisher comprising:
    a rotatable platen configured to receive a polishing pad, the polisher being operable to change a thickness of the film by rotating the platen to cause relative motion between the platen and the substrate;
    at least one light source that is configured to transmit light through the polishing pad and toward the substrate from the side of the substrate with the film to illuminate at least one section on the film and reflect light off the illuminate section; and
    at least one means for receiving the reflected light from the film on the substrate while the film is subject to thickness changes, the at least one means being operable to monitor thickness changes of the film based on the reflected light from the film on the substrate.

9. The polisher as claimed in claim 8 wherein the at least one means for monitoring thickness change based on the reflected light signal comprises a photodetector connected to one of an interferometer and a spectrophotometer.

10. The polisher as claimed in claim 8 wherein the at least one light source is configured to illuminate such that each monitored section is minimized in size to remove signal problems.

11. The polisher as claimed in claim 8, wherein the light source is configured to illuminate only one section, the section illuminated being a dedicated measurement area.

12. The polisher as claimed in claim 8 wherein the at least one means is positioned on the same side of the substrate as the light source.

13. The polisher as claimed in claim 8 wherein the light source is configured to illuminate only one section, the section illuminated being a dedicated measurement area.

14. A chemical mechanical polisher comprising:
    a movable platen configured to receive a polishing pad, the polisher being operable to polish a film on a substrate by moving the platen to cause relative motion between the platen and the substrate;
    at least one light source that is operable to transmit light through the polishing pad and toward the substrate from the side of the substrate with the film to illuminate at least one section on the film and reflect light off the illuminated section of the film; and
    at least one device to receive the reflected light from the film on the substrate while the film is being polished, the at least one device being operable to monitor a dimensional change of the film based on the reflected light from the film on the substrate.

15. The polisher of claim 14, wherein:
    the at least one device is positioned on the same side of the substrate as the light source.

16. The polisher of claim 14, wherein:
    the at least one light source is operable to illuminate such that each monitored section is minimized in size to remove signal problems.

17. The polisher of claim 14, wherein:
    the light source is configured to illuminate only one section, the section being a dedicated measurement area.

18. The polisher of claim 14, wherein:
    the light source is configured to illuminate more than one section.

19. The polisher of claim 14, wherein:
    the device that monitors a dimensional change includes a photodetector connected to send signals to one of an interferometer and a spectrophotometer.

20. The polisher of claim 14, wherein:
    the light source is a laser.

21. The polisher of claim 14, wherein:
    moving the platen includes rotating the platen.

22. The polisher of claim 14, wherein:
    transmitting light through the polishing pad includes transmitting light through a perforation in the polishing pad.

23. The polisher of claim 1, wherein:
    transmitting light through the polishing pad includes transmitting light through a perforation in the polishing pad.

* * * * *